United States Patent [19]
Kim et al.

[11] Patent Number: 5,413,947
[45] Date of Patent: May 9, 1995

[54] METHOD FOR MANUFACTURING A SEMICONDUCTOR DEVICE WITH AN EPITAXIAL VOID

[75] Inventors: Seok T. Kim, Suweon; Young S. Kim, Seoul; Yo J. Kim, Suweon, all of Rep. of Korea

[73] Assignee: Samsung Electronics Co., Ltd., Suwon, Rep. of Korea

[21] Appl. No.: 71,993

[22] Filed: Jun. 7, 1993

Related U.S. Application Data

[62] Division of Ser. No. 986,534, Dec. 7, 1992.

[30] Foreign Application Priority Data

Dec. 5, 1991 [KR] Rep. of Korea .................. 91-22197
Jan. 14, 1992 [KR] Rep. of Korea .................... 92-380

[51] Int. Cl.6 ............................................. H01L 21/338
[52] U.S. Cl. ................................. 437/41; 437/93; 437/39; 437/912; 437/927
[58] Field of Search .................. 437/228, 41, 93, 178, 437/912, 927, 39; 257/192, 194, 256, 272, 280, 286; 148/DIG. 73, DIG. 140

[56] References Cited

U.S. PATENT DOCUMENTS

| | | | |
|---|---|---|---|
| 4,178,197 | 12/1979 | Marinace | 148/175 |
| 4,546,540 | 10/1985 | Ueyanagi et al. | 29/579 |
| 5,001,077 | 3/1991 | Sakai | 437/41 |

FOREIGN PATENT DOCUMENTS

| | | |
|---|---|---|
| 60-229375 | 11/1985 | Japan. |
| 61-214481 | 9/1986 | Japan. |
| 63-120471 | 5/1988 | Japan. |

OTHER PUBLICATIONS

Chang-Tae Kim, et al., "A GaAs MESFET with Very Short Channel Length Fabricated...", Extended Abstracts of the 1991 International Conference on Solid State Devices and Materials, Yokohama, 1991, pp. 399-401.

*Primary Examiner*—George Fourson
*Attorney, Agent, or Firm*—Charles R. Donohoe; Robert A. Westerlund, Jr.; Stephen R. Whitt

[57] ABSTRACT

A compound semiconductor device is disclosed which comprises a crystally grown buffer layer formed on a semi-insulating semiconductor substrate provided with an insulating layer. The crystal growth characteristics are such that the insulating layer does not allow crystal growth on its upper surface. During its growth, the buffer layer makes reverse sloped side edges which join to form a void. A gate electrode formed above the void separates a channel from the substrate. In the δ-MESFET, side walls are formed at both sides of the gate electrodes and an N+-well region is formed by using the side walls as an ion implanting mask. Accordingly, the void separates the channel from the semiconductor substrate, thereby preventing leakage current through the buffer layer, backgating effects in an integrated circuit, and completing crystal growth without an undue effort for lowering the impurity concentration of the buffer layer. Moreover, the ion implantation for forming the well region can be performed by utilizing the gate electrode and the side walls as a mask without an ion implantation mask, thus simplifying the manufacturing process.

7 Claims, 2 Drawing Sheets

METHOD FOR MANUFACTURING A SEMICONDUCTOR DEVICE WITH AN EPITAXIAL VOID

This is a division of application Ser. No. 07/986,534, filed Dec. 7, 1992.

BACKGROUND OF THE INVENTION

1. Field of the Invention

The present invention relates to a compound semiconductor device which is characteristically noiseless, and a manufacturing method thereof. More particularly, it relates to a compound semiconductor device in which a void is formed on the substrate so that backside current does not occur and transconductance is high.

2. Description of the Related Art

Recently, rapid advances toward superspeed computers, extremely high frequency and optical communications have increased. But a conventional silicon (Si) device cannot sufficiently satisfy these needs. At present, a study of compound semiconductors having excellent material characteristics is being actively pursued.

GaAs compound semiconductors are suitable for military and space communication use because they operate faster than Si. They have lower power consumption due to better electronic characteristics, such as high electron mobility and semi-insulating properties. Accordingly, many kinds of devices utilize the excellent material characteristics of GaAs. These devices include metal semiconductor field effect transistors (hereinafter, termed as "MESFET"), heterojunction bipolar transistors and high electron mobility transistors.

The MESFET is a basic GaAs device in which source and drain electrodes form ohmic contacts with a cap layer and are in Schottky contact with each other so that current flow is controlled by a voltage applied to a gate electrode in the MESFET. Meanwhile, a delta doped MESFET (hereinafter, referred as δ-MESFET) refers to a transistor which has a low-noise characteristic and a high operation speed due to two-dimensional electron gas (hereinafter, termed as "2DEG") that is generated by forming multiple atomic layers (such as Si) on the MESFET.

FIG. 1 shows the conventional δ-MESFET structure. An undoped I-type GaAs buffer layer 12, a channel 13 delta-doped by multiple atomic layers, such as Si, and an I-type GaAs spacer layer 14 are sequentially formed on the surface of a semi-insulating GaAs semiconductor substrate 11. N+ type well regions 15, which overlap the buffer layer 12, are formed at both sides of the spacer layer 14. Source and drain electrodes 17 and 18 are formed on the well regions 15 by an ohmic contact. A gate electrode 16 is formed by a Schottky contact on a portion of the surface of the spacer layer 14 (excluding the well regions 15).

A manufacturing method of the above-described δ-MESFET is as follows. First, the I-type GaAs buffer layer 12, the channel 13 comprising multiple atomic layers of Si, and the I-type GaAs spacer layer 14 are sequentially formed on the surface of the semi-insulating GaAs semiconductor substrate 11 by molecular beam epitaxy (hereinafter, termed as "MBE") or metal organic chemical vapor deposition (hereinafter, termed as "MOCVD"). The gate electrode 16 is formed on the surface of the spacer layer 14. The N+-type well regions 15 are formed by implanting N-type impurities (such as Si) into both sides of the gate electrode using an ion implantation mask and heat-treatment. The source and drain electrodes 17 and 18 are subsequently formed on the well regions 15 by a lift-off process.

Current flow through the channel 13 is controlled by the intensity of the reverse voltage applied to the gate 16 in the δ-MESFET. Leakage current through the semiconductor substrate 11 is prevented because the buffer layer 12 increases the resistance by lowering the concentration of the impurities down to about 10E14 ions/cm$^3$. Moreover, the buffer layer 12 provides a depletion region between the channel 13 and the semiconductor substrate 11 by generating a voltage difference between electrodes of neighboring elements and a substrate in integrated circuits. The buffer layer also narrows the width of a current path to prevent backgating effects which cause increase of threshold voltage and source resistance.

However, because multiple layers are to be formed in one chamber, impurities doped into other layers increase the concentration of impurities in the buffer layer and lower the resistance, resulting in leakage current and backgating effects. Moreover, this concentration increase makes it difficult to grow crystals because the impurity concentration of the buffer layer should be low. Besides, the length of the gate electrode of each device is shortened to achieve high integration, resulting in a short channel effect and decreasing the threshold voltage. An additional mask is required during ion implantation to decrease the ohmic contact resistance of the source and drain electrodes, further complicating the manufacturing process.

SUMMARY OF THE INVENTION

It is an object of the present invention to solve these problems and to provide a compound semiconductor device which reduces dependence on a buffer layer, and reduces leakage current by separating a channel from a substrate.

It is another object of the present invention to provide a compound semiconductor device capable of preventing a backgating effect.

It is yet another object of the present invention to provide a manufacturing method of a compound semiconductor device in which a crystal growing process is effectively completed without being significantly influenced by the impurity concentration of a buffer layer.

It is a still further object of the present invention to provide a compound semiconductor device in which a short channel effect is not generated in spite of shortening of the length of a gate electrode by high integration.

It is still another object of the present invention to provide a manufacturing method of a compound semiconductor device in which ion implantation is preformed without an additional masking process.

A compound semiconductor device according to the present invention comprises:

(a) a semi-insulating substrate having a predetermined crystal direction;

(b) an insulating layer formed at a predetermined angle to a main crystal direction on the surface of the semiconductor substrate;

(c) a first conductivity type buffer layer, in which reverse mesas join during crystal growth to form a flat surface formed on the portion of the substrate not having the insulating layer;

(d) a triangular void formed by the reverse mesas of the buffer layer on the insulating layer;

(e) a channel region formed on the buffer layer with a spacer layer formed thereon;

(f) second conductivity type well regions of a high concentration formed in the spacer layer and buffer layer on both sides of the void;

(g) source and drain electrodes formed on the well regions; and (f) a gate electrode formed on the surface of the spacer layer.

Another compound semiconductor device according to the present invention comprises:

(a) a semi-insulating semiconductor substrate having a predetermined crystal plane;

(b) an insulating layer formed at a predetermined angle off from a main crystal direction on the surface of the semiconductor substrate;

(c) a first conductivity type buffer layer, in which reverse mesas join together during crystal growth to create a flat surface, formed on the surface of the substrate not having the insulating layer;

(d) a triangular void formed by the reverse mesas of the buffer layer on the insulating layer;

(e) a channel region formed on the buffer with a spacer layer formed thereon;

(f) a gate electrode formed on the surface of the spacer layer above the void;

(g) side walls formed on both sides of the gate electrode;

(h) second conductivity type well regions of a high concentration in the spacer layer and buffer layer outside the side walls; and (i) source and drain electrodes formed on the well regions.

A manufacturing method of a compound semiconductor device according to the present invention comprises the steps of:

(a) forming an insulating layer with a stripe pattern at a predetermined angle to a main crystal direction on the surface of a semi-insulating semiconductor substrate having a predetermined crystal plane;

(b) forming the first conductivity type buffer layer, in which reverse mesa portions of the buffer layer join together during crystal growth to create a flat surface atop the surface of the substrate having the insulating layer;

(c) forming a channel region having the second conductivity type impurities on the buffer layer;

(d) forming a spacer layer on the channel;

(e) forming a gate electrode on the surface of the spacer layer above the insulating layer;

(f) forming second conductivity type well regions of high concentration in the spacer layer and buffer layer on both sides of the gate electrode; and (g) forming source and drain electrodes on the surface of the well regions.

Another manufacturing method of a compound semiconductor device according to the present invention comprises the steps of:

(a) forming an insulating layer with a stripe pattern having a predetermined angle off from a main crystal direction on the surface of a semi-insulating substrate having a predetermined crystal plane, (b) forming a first conductivity type buffer layer, in which reverse mesas join together during crystal growth so as to get a flat surface, on the surface of the substrate not having the insulating layer;

(c) forming a channel region having the second conductivity type impurities on the buffer layer;

(d) forming the first conductivity type spacer layer on the channel;

(e) forming a gate electrode on the surface of the spacer layer above the insulating layer;

(f) forming side walls on both sides of the gate electrode;

(g) forming second conductivity type well regions of a high concentration in the spacer layer and buffer layer on both sides of the gate electrode; and (h) forming source and drain electrodes on the surface of the well regions.

The objects and features of the present invention will become more apparent on consideration of the following description with reference to the accompanying drawings, in which selected example embodiments are illustrated by way of example, and not by way of limitation.

DESCRIPTION OF THE PREFERRED EMBODIMENT

A preferred embodiment of a compound semiconductor device and a manufacturing method thereof according to the present invention will be described in detail below with reference to the accompanying drawings.

Figure 1:
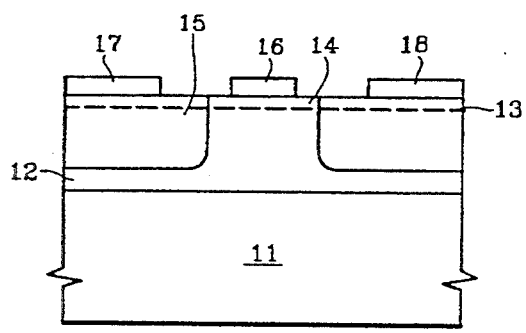
FIG. 1 is a cross-sectional view of a conventional compound semiconductor device.
Figure 2:
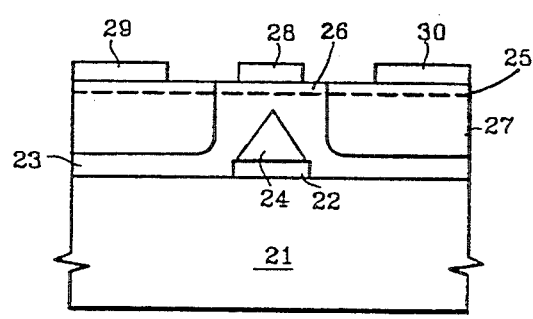
FIG. 2 is a cross-sectional view of a compound semiconductor device according to an embodiment of the present invention.

FIG. 2 is a cross-sectional view of a δ-MESFET according to a preferred embodiment of the present invention.

An insulating layer 22 with a stripe pattern is formed on a semi-insulating GaAs semiconductor substrate 21 with a (001) crystal direction. The insulating layer 22 may be made of $SiO_2$ or $Si_3N_4$ and has a thickness of about 500–1000 Å and a width of about 1–1.5 μm. The insulating layer 22 is angled about 20°–30° off from the <110> direction which represents a main crystal direction of the semi-insulating substrate 21 and serves as an epimask. An I-type GaAs buffer layer 23 with about 0.7–1 μm thickness is formed on the semiconductor substrate 21. The buffer layer 23 is not formed atop the insulating layer 22. The buffer layer 23 forms reverse sloped side edges during crystal growth which join to form a flat surface.

A triangular void 24 within the buffer layer 23 is formed atop the insulating layer 22. The height of the void 24 is limited by the length of the insulating layer 22. A channel region (25) which is doped with N-type impurities (such as Si) and an I-type GaAs spacer layer 26 which is about 200–500 Å thick are stacked on the surface of the buffer layer 23. An $N^+$-type well regions 27 are formed in the buffer layer 23 and spacer layer 26 on both sides of the void 24. Source and drain electrodes 29 and 30 are formed on the well regions 27 by an ohmic contact, and a gate electrode 28 is formed on the spacer layer 26 by Schottky contact.

The above-described δ-MESFET can be manufactured by MBE or MOCVD. The insulating layer 22 serves as a mask which does not allow crystal growth on its upper surface, but which does allow the creation of void 24. The buffer layer 23 on the semi-insulating substrate 21 is directed according to the direction of the insulating layer 22. The insulating layer 22 has an axis of elongation which forms an angle of about 20°–30° with the (001) crystal direction representing a main crystal direction of the semi-insulating substrate 21. The buffer layer 23 has reverse sloped side edges which join together so as to form a void 24.

Figure 3:
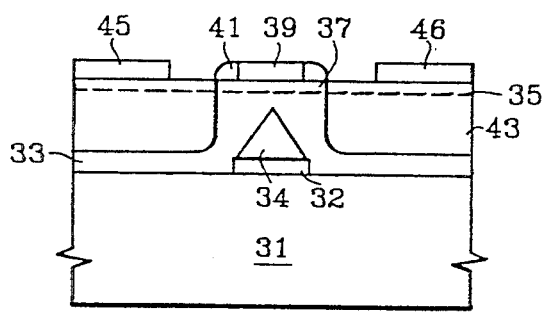
FIG. 3 is a cross-sectional view of a compound semiconductor device according to another embodiment of the present invention.

FIG. 3 is a vertical cross-sectional view of δ-MESFET according to another embodiment of the present invention.

An insulating layer 32 with a stripe pattern is formed on a semi-insulating GaAs substrate 31 with a (001) crystal direction. The insulating layer 32 is made of $SiO_2$ or $Si_3N_4$ and is about 500–1000 Å thick and about 1–1.5 μm in width. The insulating layer 32 is angled about 20°–30° off from the <110> direction which represents a main crystal direction of the semi-insulating substrate 31 and serves as an epimask. An undoped I-type GaAs buffer layer 33 about 0.7–1 μm thick is formed on the semi-insulating substrate 31. The buffer layer 33 is not formed atop the insulating layer 32. During crystal growth, reverse sloped side edges are formed which join together to form a flat surface by vertical and horizontal growth.

A triangular void 34 within the buffer layer 33 is formed on the insulating layer 32. The height of the void 34 is limited by the angle and width of the insulating layer 32. A channel region 35 which is doped with N-type impurities (such as Si) and an I-type GaAs spacer layer 37 about 200–500 Å thick is stacked on the surface of the buffer layer 33. A gate electrode 39 about 0.5–0.8 μm in length is formed on the surface of the spacer layer 37 above the void 34 and makes a Schottky contact. Side walls 41 made of an insulator such as $SiO_2$, $Si_3N_4$ or phosphorous silicate glass (hereinafter, termed as "PSG") are provided on both sides of the gate electrode 39. N+-type well regions 43 are formed in the buffer layer 33 and the spacer layer 37 outside the side walls. Source and drain electrodes 45 and 46 are formed on the well regions 43 by an ohmic contact.

The above-described δ-MESFET can be manufactured by an epitaxial growth method such as MBE or MOCVD. The insulating layer 32 does not allow crystal growth on its upper surface. The buffer layer 33 simultaneously experiences vertical and horizontal growth, according to the direction of the crystal plane of the semiconductor substrate 31 and the insulating layer 32, to make reverse sloped side edges which join together to form a void 34.

The void 34 separates the channel 35 from the semi-insulating substrate 31, thereby preventing leakage current and backgating effects. Furthermore, the side walls 41 cover the spacer layer 33 to prevent a short channel effect from causing an abnormal current-voltage curve and an increase of threshold voltage.

Figure 4A:
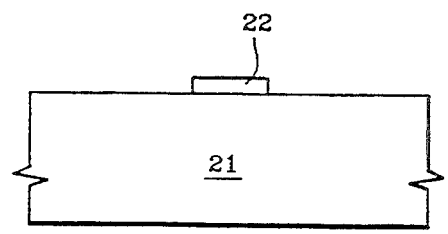
FIGS. 4A to 4C are drawings illustrating a manufacturing process of a compound semiconductor device according to an embodiment of the present invention.
Figure 4B:
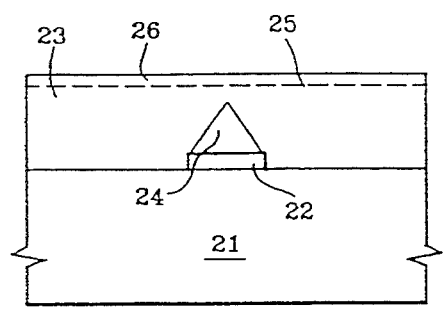
Figure 4C:
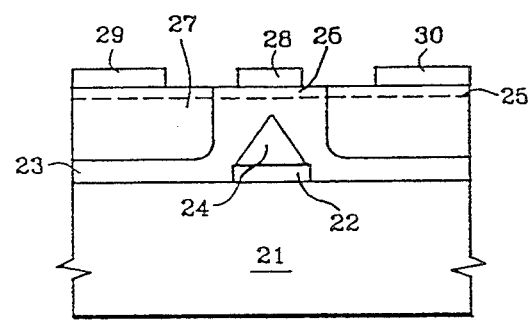

FIGS. 4A to 4C are drawings illustrating a manufacturing process of the δ-MESFET of FIG. 2, according to a preferred embodiment of the present invention. The same reference numbers are given for the same parts.

As shown in FIG. 4A, the insulating layer 22 is deposited on the semi-insulating GaAs semiconductor substrate 21 with a (001) crystal direction, the insulating layer 22 being made of $SiO_2$ or $Si_3N_4$ and having about 500–1000 Å thickness. The insulating layer 22 is angled about 20°–30° off from a main crystal direction <110> of the semi-insulating substrate 21 and is about 1–1.5 μm wide.

As shown in FIG. 4B, the I-type GaAs buffer layer 23, the channel region 25 (which is doped with N-type impurities such as Si), and the I-type GaAs spacer layer 26 are sequentially formed by MBE or MOCVD from the portion of the semiconductor substrate 21 not covered by the insulating layer 22. The buffer layer 23 is about 0.7–1 μm thick and is not formed atop the insulating layer 22. During the crystalline growth of the buffer layer 23, reverse sloped side edges are formed which join together to form a flat upper surface. At this time, the reverse sloped side edges also define a void 24. The height of the void 24 is determined by the length of the insulating layer 22. The spacer layer 26 is about 200–500 Å thick.

As shown in FIG. 4C, the gate electrode 28 is formed by dry etching after depositing Pd, Pt, Au, etc. on the surface of the spacer layer 26. N+-type well regions 27 are formed in layer 23 and spacer layer 26 on both sides of the gate electrode 28 by thermal treatment following ion-implantation of N-type impurities at a concentration of about 1E13–1E14 ions/$cm^2$ and at an energy of about 50–100 KeV. The source and drain electrodes 29 and 30 are formed on the well region 27 by a conventional lift-off process.

FIGS. 5A to 5D are drawings illustrating a manufacturing process of δ-MESFET of FIG. 3 according to a preferred embodiment of the present invention. The same reference numbers are given for the same parts.

Figure 5A:
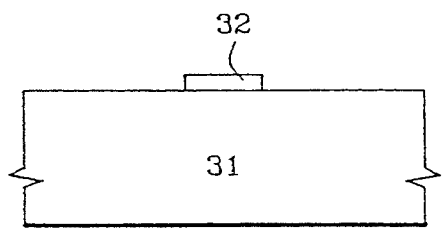
FIGS. 5A to 5D are drawings illustrating a manufacturing process of a compound semiconductor device according to another embodiment of the present invention.

As shown in FIG. 5A, the insulator is deposited on the semi-insulating GaAs semiconductor substrate 31 with (001) crystal direction, the insulator being made of $SiO_2$ or $Si_3N_4$ and having about 500–1000 Å thickness. The insulating layer 32 is next formed so as to be about 20°–30° off from a main crystal direction <110> of the semiconductor substrate 31 after removing the insulator by a conventional photolithography.

Figure 5B:
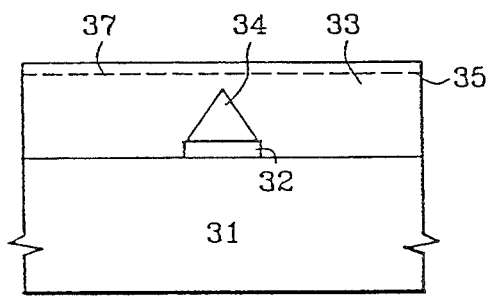

As shown in FIG. 5B, the I-type GaAs buffer layer 33, the channel region 35 (which is doped with N-type impurities such as Si), and the I-type GaAs spacer layer 37 are sequentially formed on the semiconductor substrate 31 by an epitaxy method such as MBE or MOCVD. The buffer layer 33 is about 0.7–1 μm thick and is not formed on top of the insulating layer 32. It has reverse sloped side edges which join together to create a flat upper surface by simultaneously vertical and horizontal growth. The reverse sloped side edges define a void 34. The height of the void 34 is determined by the angle and the length of the insulating layer 32. The spacer layer 37 is about 200–500 Å thick.

Figure 5C:
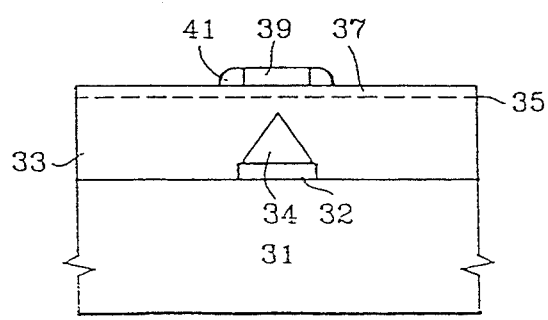

As shown in FIG. 5C, the gate electrode 39 (about 0.5–0.8 μm long) is formed on the void 34 by dry etching after depositing Pd, Pt, Au, etc. on the surface of the spacer layer 37. The side walls 41 are formed at both side parts of the gate electrode 39 by etchback after thickly depositing $SiO_2$, $Si_3N_4$ or PSG by chemical vapor deposition (CVD) on the entire surface of the above-described structure.

Figure 5D:
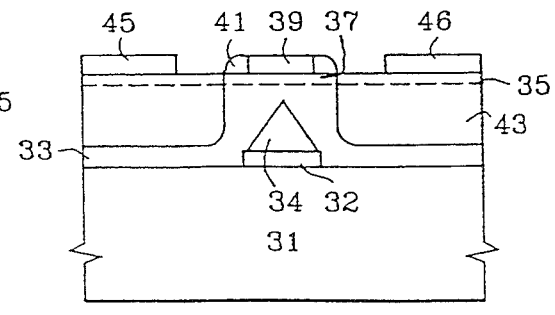

As shown in FIG. 5D, N+-type well regions 43 is formed in the buffer layer 33 and spacer layer 37 by heat-treatment after ion-implanting N-type impurities (such as Si) through the exposed surface of the spacer layer 37 at a concentration of about 1E13–1E14 ions/cm$^2$ and at an energy of about 50–100 KeV. The gate electrode 39 and the side walls 41 serve as an ion-implanting mask. The source and drain electrodes 45 and 46 (made of AuGe, Ni, Au, etc.) are formed on the well regions 43 by a conventional lift-off process.

Even though the above-described embodiment adopts GaAs having a (001) crystal direction as a semi-insulating substrate, GaAs with {100} direction or other compound semiconductors such as InP or GaP may also be adopted for the present invention.

As described hereinabove, a buffer layer is formed on the semi-insulating semiconductor substrate having an insulating layer by utilizing the fact that the insulating layer does not allow crystal growth on its upper surface. The buffer layer makes reverse sloped side edges which join together to define a void. The gate electrode formed on the void separates the channel from the substrate.

According to one aspect of the present invention, side walls are formed at both sides of the gate electrode. The N$^+$-well region is formed by using the side walls as an ion implanting mask so that the spacer layer on the channel is not exposed.

The triangular void separates the channel from the semiconductor substrate, thereby preventing leakage current through the buffer layer and backgating effects in an integrated circuit, and completing crystal growth without undue effort.

Furthermore, according to the present invention, the side walls provided at both sides of the gate electrode hide the spacer layer on the channel, preventing an abnormal current-voltage curve and a short channel effect. Moreover, the ion implantation for forming the well regions can be performed by utilizing the gate electrode and the side walls as a mask without an ion implantation mask, which simplifies the manufacturing process.

The present invention is in no way limited to the embodiments described hereinabove. Various modifications of disclosed embodiment of the present invention will become apparent to persons skilled in the art upon reference to the description of the present invention. Therefore, the appended claims will cover any such modifications or embodiment as fall within the true scope of the present invention.

What is claimed is:

1. A manufacturing method of a compound semiconductor device comprising the steps of:

forming an insulating layer at an angle to a main crystal direction on a portion of a semi-insulating semiconductor substrate having a crystal direction;

forming a first conductivity type buffer layer on said semi-insulating semiconductor substrate, respective portions of said buffer layer converging above the insulating layer to form a closed void within the buffer layer over said insulating layer;

forming a second conductivity type channel region on said buffer layer;

forming a first conductivity type spacer layer on said channel region;

forming a gate electrode on the surface of said spacer layer, spaced above said insulating layer;

forming side walls on both sides of said gate electrode;

forming second conductivity type well regions in said buffer layer and said spacer layer, outside said side walls; and forming source and drain electrodes on respective said well regions.

2. The manufacturing method of the compound semiconductor device according to claim 1, wherein said steps of forming a buffer layer, channel region, spacer layer, and a gate electrode are performed by molecular beam epitaxy.

3. The manufacturing method of the compound semiconductor device according to claim 1, wherein said steps of forming a buffer layer, channel region, spacer layer, and a gate electrode are performed by metal organic chemical vapor deposition.

4. The manufacturing method of the compound semiconductor device according to claim 2, wherein the step of forming sidewalls comprises the sub-steps of depositing an insulating layer on the entire surface of the structure and etching back the insulating layer.

5. The manufacturing method of the compound semiconductor device according to claim 3, wherein the step of forming sidewalls comprises the sub-steps of depositing an insulating layer on the entire surface of the structure and etching back the insulating layer.

6. The manufacturing method of the compound semiconductor device according to claim 2, wherein the step of forming source and drain electrodes comprises the sub-steps of ion-implantation which uses said gate electrode and said side walls as a mask, and heat-treatment of the ion-implanted structure.

7. The manufacturing method of the compound semiconductor device according to claim 3, wherein the step of forming source and drain electrodes comprises the sub-steps of ion-implantation which uses said gate electrode and said side walls as a mask, and heat-treatment of the ion-implanted structure.

* * * * *